(12) United States Patent
Leng

(10) Patent No.: US 12,310,041 B2
(45) Date of Patent: May 20, 2025

(54) METAL-INSULATOR-METAL (MIM) CAPACITOR MODULE WITH OUTER ELECTRODE EXTENSION

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 481 days.

(21) Appl. No.: 17/827,648

(22) Filed: May 27, 2022

(65) Prior Publication Data

US 2023/0268376 A1 Aug. 24, 2023

Related U.S. Application Data

(60) Provisional application No. 63/313,410, filed on Feb. 24, 2022.

(51) Int. Cl.
*H10D 1/68* (2025.01)
*H01L 21/768* (2006.01)
*H01L 23/522* (2006.01)

(52) U.S. Cl.
CPC ....... *H10D 1/692* (2025.01); *H01L 21/76877* (2013.01); *H01L 23/5223* (2013.01);
(Continued)

(58) Field of Classification Search
CPC ............... H01L 28/60; H01L 21/76877; H01L 23/5223; H01L 23/5226; H01L 21/76843; H01L 21/7687
See application file for complete search history.

(56) References Cited

U.S. PATENT DOCUMENTS

| 5,275,974 A | 1/1994 | Ellul et al. ..................... 438/386 |
| 2002/0022333 A1 | 2/2002 | Morand et al. ............... 438/396 |

(Continued)

OTHER PUBLICATIONS

Ng, C. H. et al., "Characterization and Comparison of Two Metal-Insulator-Metal Capacitor Schemes in 0.13 m Copper Dual Damascene Metallization Process for Mixed-Mode and RF Applications," in IEDM Tech. Dig., pp. 241-244.

(Continued)

*Primary Examiner* — Monica D Harrison
*Assistant Examiner* — Andre C Stevenson
(74) *Attorney, Agent, or Firm* — SLAYDEN GRUBERT BEARD PLLC

(57) ABSTRACT

A metal-insulator-metal (MIM) capacitor module includes an outer electrode, an insulator, an inner electrode, an outer electrode extension structure, an inner electrode contact element, and an outer electrode contact element. The outer electrode includes a plurality of vertically-extending outer electrode sidewalls. The insulator is formed in an opening defined by the vertically-extending outer electrode sidewalls, and includes a plurality of vertically-extending insulator sidewalls. The inner electrode formed in an interior opening defined by the insulator. The outer electrode extension structure extends laterally from a particular vertically-extending outer electrode sidewall. The inner electrode contact element and outer electrode contact element are formed in a metal layer. The inner electrode contact element is electrically connected to the inner electrode, and the outer electrode contact element is electrically connected to the outer electrode extension structure.

12 Claims, 15 Drawing Sheets

(52) U.S. Cl.
CPC .... *H01L 23/5226* (2013.01); *H01L 21/76843* (2013.01); *H01L 21/7687* (2013.01)

(56) References Cited

U.S. PATENT DOCUMENTS

| | | | | |
|---|---|---|---|---|
| 2006/0086952 A1* | 4/2006 | Kim | ......................... | H01L 28/91 257/211 |
| 2011/0037145 A1* | 2/2011 | Lee | ..................... | H01L 23/5223 257/532 |
| 2018/0337122 A1* | 11/2018 | Liao | ..................... | H01L 23/5226 |

OTHER PUBLICATIONS

International Search Report and Written Opinion, Application No. PCT/US2022/35440, 13 pages.

* cited by examiner

METAL-INSULATOR-METAL (MIM) CAPACITOR MODULE WITH OUTER ELECTRODE EXTENSION

RELATED PATENT APPLICATION

This application claims priority to commonly owned U.S. Provisional Patent Application No. 63/313,410 filed Feb. 24, 2022, the entire contents of which are hereby incorporated by reference for all purposes.

TECHNICAL FIELD

The present disclosure relates to metal-insulator-metal (MIM) capacitors formed in integrated circuit (IC) devices, and more particularly, to an MIM capacitor module with an outer electrode extension.

BACKGROUND

Integrated capacitors are key analog components in analog/mixed signal/RF-CMOS circuits. Two types of integrated capacitors are MOM (Metal-Oxide-Metal lateral flux) capacitors and MIM (Metal-Insulator-Metal) capacitors, each with respective advantages and disadvantages.

In a typical MOM capacitor, the capacitor plates (electrodes) are defined by laterally adjacent metal lines formed on one or multiple metal layers (e.g., multiple interconnect layers), which capacitor plates define a lateral electric field (thus the name lateral flux capacitor). MOM capacitors may be formed at low (or no) additional cost with respect to a background integrated circuit structure, as they often utilize existing interconnect wiring. However, MOM capacitors may be less robust and may exhibit poor matching for analog circuits (e.g., matching device characteristics such as resistance and capacitance, as compared with other types of capacitors), and are generally incompatible with low-k dielectrics.

In contrast, a typical MIM capacitor includes capacitor plates (electrodes) that extend horizontally, i.e., parallel to the device substrate (e.g., silicon substrate), thus defining a vertical electric field. MIM capacitors typically exhibit better performance than MOM capacitors due to lower resistance, better matching for analog circuits, and/or better signal/noise characteristics. However, MIM capacitors are typically more expensive than MOM capacitors, as the construction of a MIM capacitor typical requires at least one additional photomask process to the background IC fabrication process.

There is a need for improved MIM capacitors, for example MIM capacitors constructed with no additional masks added to the respective background integrated circuit fabrication process.

SUMMARY

Improved MIM capacitor modules are disclosed. As used herein, a "MIM capacitor module" includes the fundamental elements of an MIM capacitor, e.g., an insulator (dielectric) arranged between conductive electrodes (e.g., conductive plates), and may also include certain related elements, e.g., conductive elements providing electrical contact to the conductive electrodes.

In some examples, a MIM capacitor module includes an outer electrode, an insulator, an inner electrode, an outer electrode extension structure, an inner electrode contact element, and an outer electrode contact element. The outer electrode includes multiple vertically-extending outer electrode sidewalls. The insulator is formed in an opening defined by the multiple vertically-extending outer electrode sidewalls, and includes multiple vertically-extending insulator sidewalls. The inner electrode is formed in an interior opening defined by the insulator, such that respective vertically-extending insulator sidewalls are arranged between the inner electrode and respective vertically-extending outer electrode sidewalls.

The outer electrode extension structure extends laterally from a particular vertically-extending outer electrode sidewall, in a lateral direction away from the inner electrode. The inner electrode contact element is electrically connected to the inner electrode, and the outer electrode contact element is electrically connected to the outer electrode extension structure. In some examples, the inner electrode contact element and outer electrode contact element are formed in a common (i.e., same) metal layer, for example a metal-1 interconnect layer.

The inner electrode is capacitively coupled to each vertically-extending outer electrode sidewall through a respective vertically-extending insulator sidewall, to effectively define multiple (e.g., four) vertical-plate capacitor units, each vertical-plate capacitor unit including (a) a vertically-extending dielectric region, defined by a respective vertically-extending insulator sidewall, arranged between (b) a pair of vertically-extending capacitor plates, defined by the inner electrode and a respective vertically-extending outer electrode sidewall, such that each vertical-plate capacitor unit creates a horizontally-extending electric field (E-field), e.g., extending parallel to a device substrate (e.g., silicon wafer substrate).

In some examples, the MIM capacitor module is formed free of structures that effectively define a horizontal plate capacitor unit, i.e., structures that create a vertically-extending electric field. For example, the outer electrode may include the multiple vertically-extending outer electrode sidewalls, effectively defining multiple vertically-extending capacitor plates, but may substantially omit any laterally-extending elements that may act as a horizontally-extending capacitor plate. In some examples, the outer electrode is constructed by a process including depositing a conformal metal layer that forms an outer electrode cup including a plurality of vertically-extending outer electrode sidewalls extending upwardly from a laterally-extending outer electrode cup base, and subsequently removing (e.g., etching) the laterally-extending outer electrode cup base and other laterally-extending portions of the conformal metal layer, leaving the vertically-extending outer electrode sidewalls.

In some examples, by removing the laterally-extending outer electrode cup base to form the MIM capacitor module effectively including vertical-plate capacitor units but no horizontal-plate capacitor units, the resulting electrical field characteristics of the MIM capacitor module may be simplified, e.g., as compared with a MIM capacitor modules including a cup-shaped outer electrode (i.e., wherein a horizontal-plate capacitor unit is effectively defined between the laterally-extending outer electrode cup base and a bottom surface of the inner electrode). This simplification of the electrical field characteristics of the MIM capacitor module may be desirable or advantageous in analog circuits, for example where it may be important or advantageous to construct pairs of MIM capacitor modules having precisely matching electrical characteristics.

In addition, by removing the laterally-extending outer electrode cup base, unwanted electrical field corner effects (at corners between the laterally-extending outer electrode cup base and vertically-extending outer electrode sidewalls) may be reduced or eliminated, which may increase the breakdown voltage of the MIM capacitor module.

In some examples, the MIM capacitor module may be constructed using a damascene process without added photomask layers, as compared with a background IC fabrication process.

In some examples, the MIM capacitor module may be constructed concurrently with elements of an IC component structure, e.g., contact structures for providing an electrical contact to active components, e.g., transistors, and allow compact device design.

One aspect provides an MIM capacitor module including an outer electrode, an insulator, an inner electrode, an outer electrode extension structure, an inner electrode contact element, and an outer electrode contact element. The outer electrode comprises a plurality of vertically-extending outer electrode sidewalls. The insulator is formed in an opening defined by the plurality of vertically-extending outer electrode sidewalls, the insulator comprising a plurality of vertically-extending insulator sidewalls. The inner electrode is formed in an interior opening defined by the plurality of vertically-extending insulator sidewalls. Respective ones of the plurality of vertically-extending insulator sidewalls are arranged between the inner electrode and a respective one of the plurality of vertically-extending outer electrode sidewalls. The outer electrode extension structure extends laterally from a particular vertically-extending outer electrode sidewall of the plurality of vertically-extending outer electrode sidewalls. The inner electrode contact element and outer electrode contact element are formed in a metal layer, wherein the inner electrode contact element is electrically connected to the inner electrode, and the outer electrode contact element is electrically connected to the outer electrode extension structure.

In some examples, the particular vertically-extending outer electrode sidewall is elongated in a first lateral direction, and the outer electrode extension structure is elongated in a second lateral direction perpendicular to the first lateral direction.

In some examples, the outer electrode has a closed-loop perimeter defined by the plurality of vertically-extending outer electrode sidewalls, and the insulator has a closed-loop perimeter defined by the plurality of vertically-extending insulator sidewalls.

In some examples, the insulator has a cup-shaped structure including the plurality of vertically-extending insulator sidewalls extending upwardly from a laterally-extending insulator base.

In some examples, the laterally-extending insulator base lies directly on a dielectric region.

Another aspect provides a device including an MIM capacitor module and an IC component structure. The MIM capacitor module includes an outer electrode, an insulator, an inner electrode, an outer electrode extension structure, an inner electrode contact element, and an outer electrode contact element. The outer electrode comprises a plurality of vertically-extending outer electrode sidewalls formed from a conformal metal. The insulator is formed in an opening defined by the plurality of vertically-extending outer electrode sidewalls, and comprises a plurality of vertically-extending insulator sidewalls. The inner electrode is formed in an interior opening defined by the plurality of vertically-extending insulator sidewalls. Respective ones of the plurality of vertically-extending insulator sidewalls are arranged between the inner electrode and a respective one of the plurality of vertically-extending outer electrode sidewalls. The outer electrode extension structure extends laterally from a particular vertically-extending outer electrode sidewall of the plurality of vertically-extending outer electrode sidewalls. The inner electrode contact element and outer electrode contact element are formed in a metal layer, wherein the inner electrode contact element is electrically connected to the inner electrode, and the outer electrode contact element is electrically connected to the outer electrode extension structure. The IC component structure includes an IC component, a vertically extending IC component contact formed from the conformal metal, the vertically-extending IC component contact formed above the IC component and electrically connected to the IC component, and an IC component connection element formed in the metal layer and electrically connected to the vertically-extending IC component contact.

In some examples, the IC component comprises a silicided polysilicon structure.

In some examples, the IC component comprises a transistor component.

In some examples, the particular vertically-extending outer electrode sidewall is elongated in a first lateral direction, and the outer electrode extension structure is elongated in a second lateral direction perpendicular to the first lateral direction.

In some examples, the outer electrode has a closed-loop perimeter defined by the plurality of vertically-extending outer electrode sidewalls, and the insulator has a closed-loop perimeter defined by the plurality of vertically-extending insulator sidewalls.

In some examples, the insulator has a cup-shaped structure including the plurality of vertically-extending insulator sidewalls extending upwardly from a laterally-extending insulator base.

In some examples, the laterally-extending insulator base lies directly on a dielectric region.

Another aspect provides a method. The method includes forming an outer electrode opening in a dielectric region, the outer electrode opening including a tub opening region and an extension opening region extending laterally from the tub opening region. The method further includes depositing a conformal metal layer over the dielectric region and extending down into the outer electrode opening to form (a) an outer electrode cup in the tub opening region and (b) an outer electrode extension structure in the extension opening region. The outer electrode cup includes a laterally-extending outer electrode cup base and a plurality of vertically-extending outer electrode sidewalls extending upwardly from the laterally-extending outer electrode cup base. The outer electrode extension structure extends laterally from a particular vertically-extending outer electrode sidewall of the plurality of vertically-extending outer electrode sidewalls. The method further includes depositing an insulator layer forming a cup-shaped insulator in an opening defined by the plurality of vertically-extending outer electrode sidewalls, the cup-shaped insulator including a laterally-extending insulator base and a plurality of vertically-extending insulator sidewalls extending upwardly from the laterally-extending insulator base. The method further includes depositing an inner electrode layer over the insulator layer and extending into an opening defined by the cup-shaped insulator. The method further includes performing a planarization process to remove upper portions of the insulator layer and inner electrode layer, wherein a remaining portion of the inner electrode layer defines an inner electrode. The method further includes forming a metal layer including (a) an inner electrode contact element electrically connected to the inner electrode and (b) an outer electrode contact element electrically connected to the outer electrode extension structure.

In some examples, the method includes performing an etch process to remove the laterally-extending outer electrode cup base prior to depositing the insulator layer.

In some examples, forming the outer electrode opening in the dielectric region exposes a dielectric surface at a bottom of the tub opening region, and depositing the insulator layer forming the cup-shaped insulator comprises depositing the laterally-extending insulator base on the exposed dielectric surface at the bottom of the tub opening region.

In some examples, the method includes, prior to forming the metal layer, depositing an etch stop layer on a planarized surface defined by the planarization process.

In some examples, the method includes forming an integrated circuit (IC) component contact opening in the dielectric region and laterally spaced apart from the outer electrode opening, the IC component contact opening exposing an underlying IC component, wherein the deposited conformal metal layer extends down into the IC component contact opening to form a vertically-extending IC component contact, and wherein the metal layer includes (a) the inner electrode contact element electrically connected to the inner electrode, (b) the outer electrode contact element electrically connected to the outer electrode extension structure, and (c) an IC component connection element electrically connected to the IC component contact.

In some examples, the IC component comprises a silicided polysilicon structure.

In some examples, the IC component comprises a transistor component.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
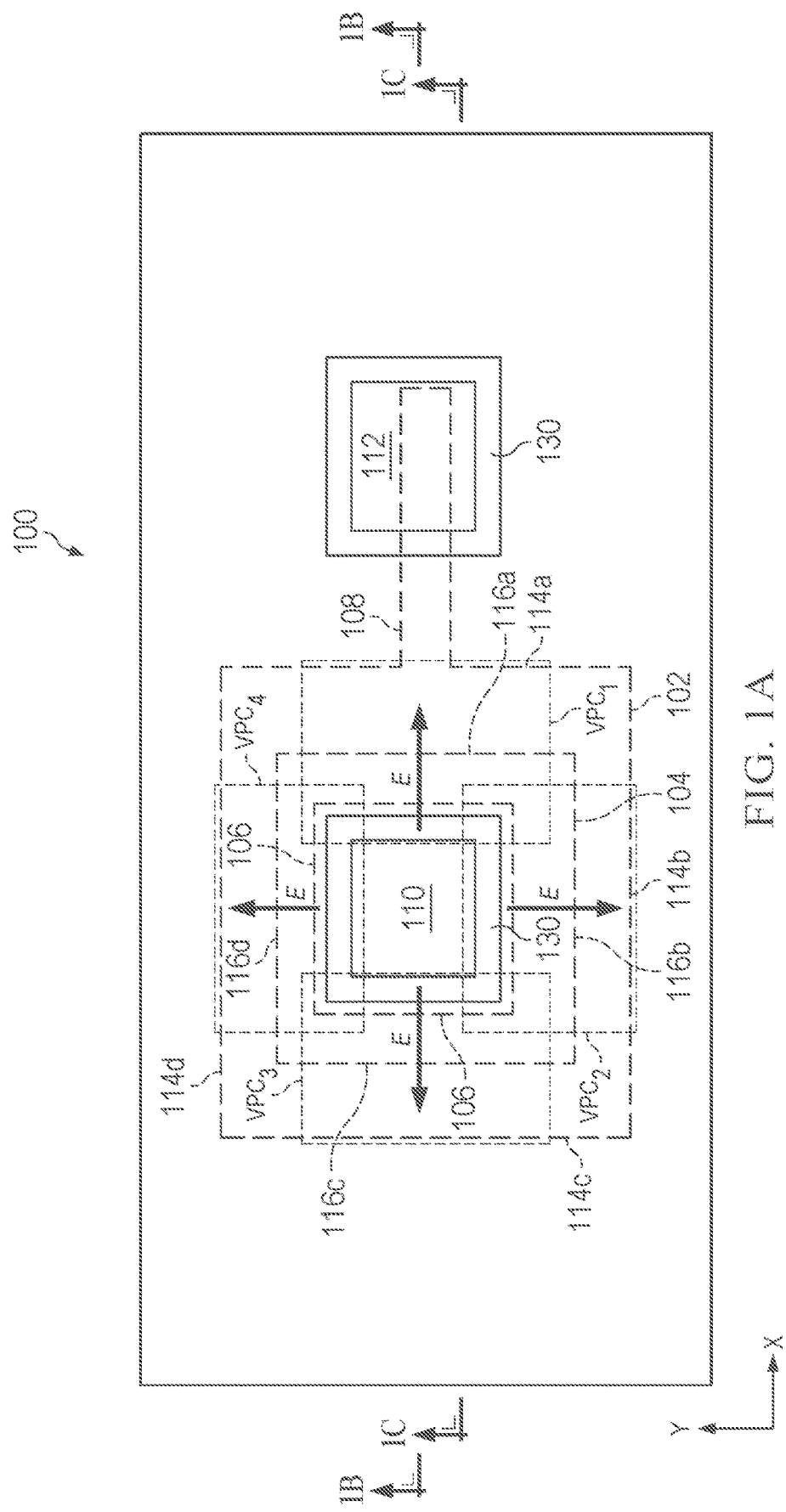
FIG. 1A is a top view and FIGS. 1B and 1C are two side cross-sectional views of an example MIM capacitor module.
Figure 1B:
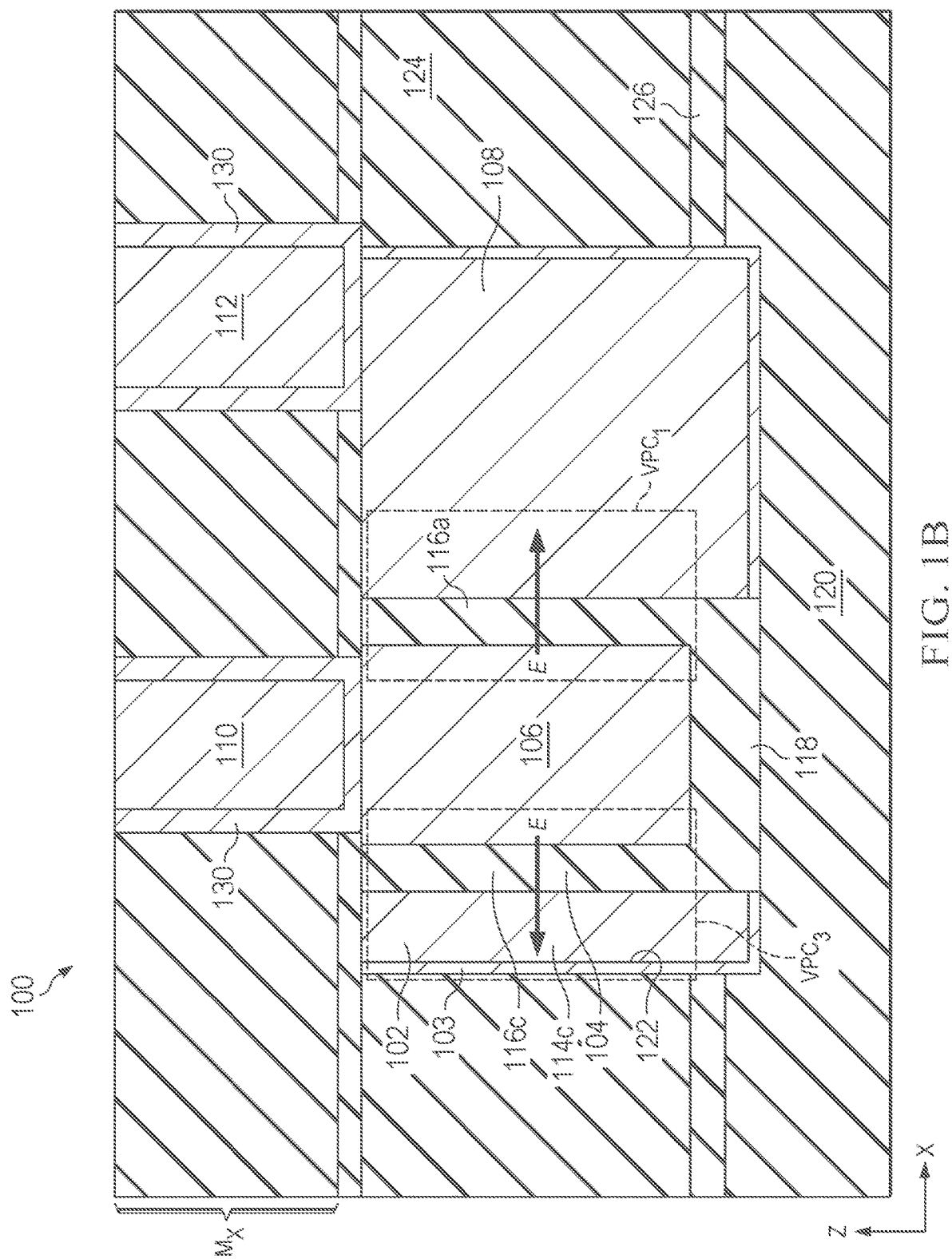
Figure 1C:
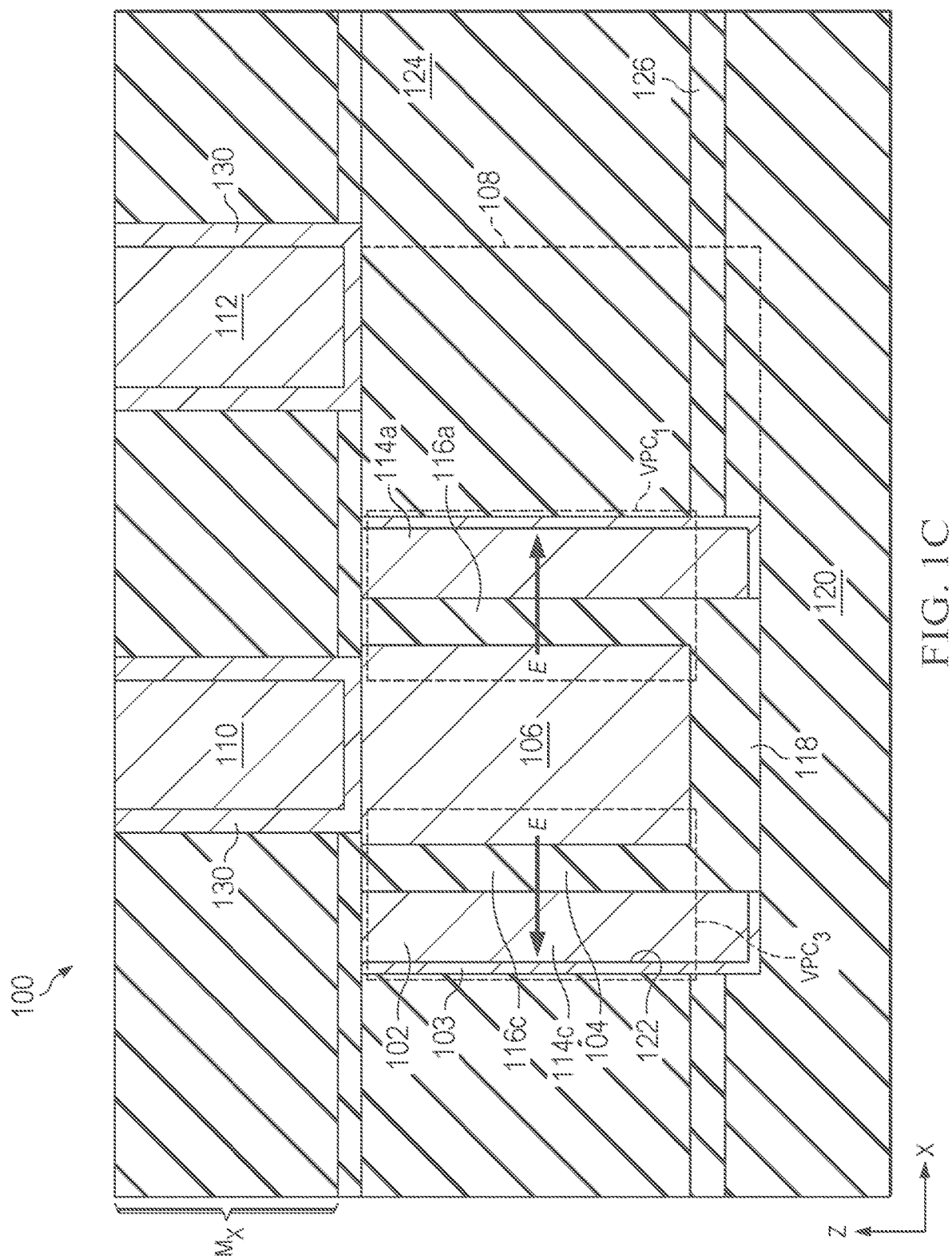

FIGS. 1A-1C show an example MIM capacitor module 100 according to the present disclosure. In particular, FIG. 1A shows a top view of the MIM capacitor module 100, FIG. 1B shows a first cross-sectional side view of the MIM capacitor module 100 through cut line 1B-1B shown in FIG. 1A, and FIG. 1C shows a second cross-sectional side view of the MIM capacitor module 100 through cut line 1C-1C shown in FIG. 1A. As shown, MIM capacitor module 100 includes (a) an outer electrode 102, (b) an insulator 104, (c) an inner electrode 106, (d) an outer electrode extension structure 108, (e) an inner electrode contact element 110, and (f) an outer electrode contact element 112.

The outer electrode 102 includes a plurality of vertically-extending outer electrode sidewalls 114a-114d, e.g., extending upwardly from a lower dielectric region 120, e.g., an oxide region formed over a silicon substrate. In this example, the vertically-extending outer electrode sidewalls 114a-114d define a closed-loop perimeter in a horizontal (x-y) plane. The outer electrode 102 may comprise a conformal metal, e.g., tungsten, which may be deposited over a liner 103, e.g., comprising TiN, as discussed below with reference to FIG. 3C. The outer electrode extension structure 108 extends laterally from a particular vertically-extending outer electrode sidewall 114a-114d, in this example vertically-extending outer electrode sidewall 114a. In some examples, the outer electrode extension structure 108 extends perpendicularly from the particular vertically-extending outer electrode sidewall 114a in the x-y plane. In the example shown in FIG. 1A, the outer electrode sidewall 114a is laterally elongated in the y-direction, and the outer electrode extension structure 108 is elongated in the x-direction, i.e., perpendicular to the y-direction elongation of the outer electrode sidewall 114a.

It should be understood that the term "particular" in the context of "a particular vertically-extending outer electrode sidewall" is used merely for reference and does not imply any distinct characteristic of the particular vertically-extending outer electrode sidewall in relation to the other vertically-extending outer electrode sidewalls.

The insulator 104 is formed within the closed-loop perimeter defined by the vertically-extending outer electrode sidewalls 114a-114d. The insulator 104 includes a plurality of vertically-extending insulator sidewalls 116a-116d extending upwardly from a laterally-extending insulator base 118 formed on the dielectric region 120. In this example, the vertically-extending insulator sidewalls 116a-116d also define a closed-loop perimeter in a horizontal (x-y) plane. In some examples, the insulator 104 comprises SiN, SiO2, or a high-k dielectric (e.g., having a dielectric constant greater than 7), for example $Al_2O_3$, $Ta_2O_5$, $HfO_2$, or $ZrO_2$. The liner 103, outer electrode 102, and insulator 104 may be formed in a tub opening 122 formed in a dielectric region 124, e.g., a pre-metal dielectric region (PMD). In some examples, dielectric region 124 may comprise silicon oxide, phosphorus silicate glass (PSG), or borophosphosilicate glass (BPSG). As discussed below, the tub opening 122 may extend through an (optional) etch stop layer 126, e.g., a silicon nitride etch stop layer, formed on the lower dielectric region 120.

In other examples, insulator 104 may omit the laterally-extending insulator base 118. Thus, insulator 104 may include vertically-extending insulator sidewalls 116a-116d extending upwardly from dielectric region 120, without the laterally-extending insulator base 118. For example, the laterally-extending insulator base 118 may be removed by an optional etch process, e.g., as discussed below with respect to FIG. 3F.

The inner electrode 106 is formed in an interior opening defined by the plurality of vertically-extending insulator sidewalls 116a-116d. In some examples, the inner electrode 106 may comprise Al, Ti, TiN, W, TiW, Co, Ta, TaN, Cu, or any combination thereof, for example, TiN plus Al, TiN plus W, or a Ta/TaN bilayer plus Cu.

The inner electrode contact element 110 and outer electrode contact element 112 may be formed over a conductive barrier layer 130, e.g., comprising a barrier layer (e.g., a TaN/Ta bilayer). The inner electrode contact element 110 is electrically connected to the inner electrode 106 (by direct contact or through conductive barrier layer 130, if present), and the outer electrode contact element 112 is electrically connected to the outer electrode extension structure 108 (by direct contact or through conductive barrier layer 130, if present). The inner electrode contact element 110 and outer electrode contact element 112 are formed in a common (i.e., same) metal layer $M_x$, for example a Metal-1 interconnect layer formed from copper.

As shown in FIGS. 1A-1C, respective vertically-extending insulator sidewalls 116a-116d are arranged between the inner electrode 106 and respective vertically-extending outer electrode sidewalls 114a-114d. Thus, the inner electrode 106 is capacitively coupled to each vertically-extending outer electrode sidewalls 114a-114d through a respective vertically-extending insulator sidewall 116a-116d, to effectively define four vertical-plate capacitor units, indicated generally at $VPC_1$-$VPC_4$, each having a vertically-extending dielectric (defined by a respective vertically-extending insulator sidewall 116a-116d) arranged between a pair of vertically-extending capacitor plates (defined by the inner electrode 106 and a respective vertically-extending outer electrode sidewall 114a-114d), and each creating a horizontally-extending electric field "E," extending in the x-direction or y-direction.

In the example shown in FIGS. 1A-1C, MIM capacitor module 100 includes vertical-plate capacitor units $VPC_1$-$VPC_4$ creating respective horizontally-extending (x-direction or y-direction) electric fields (electric fields E shown in FIGS. 1A-1C), and excludes any horizontal-plate capacitor unit creating a vertically-extending (z-direction) electric field.

Figure 2A:
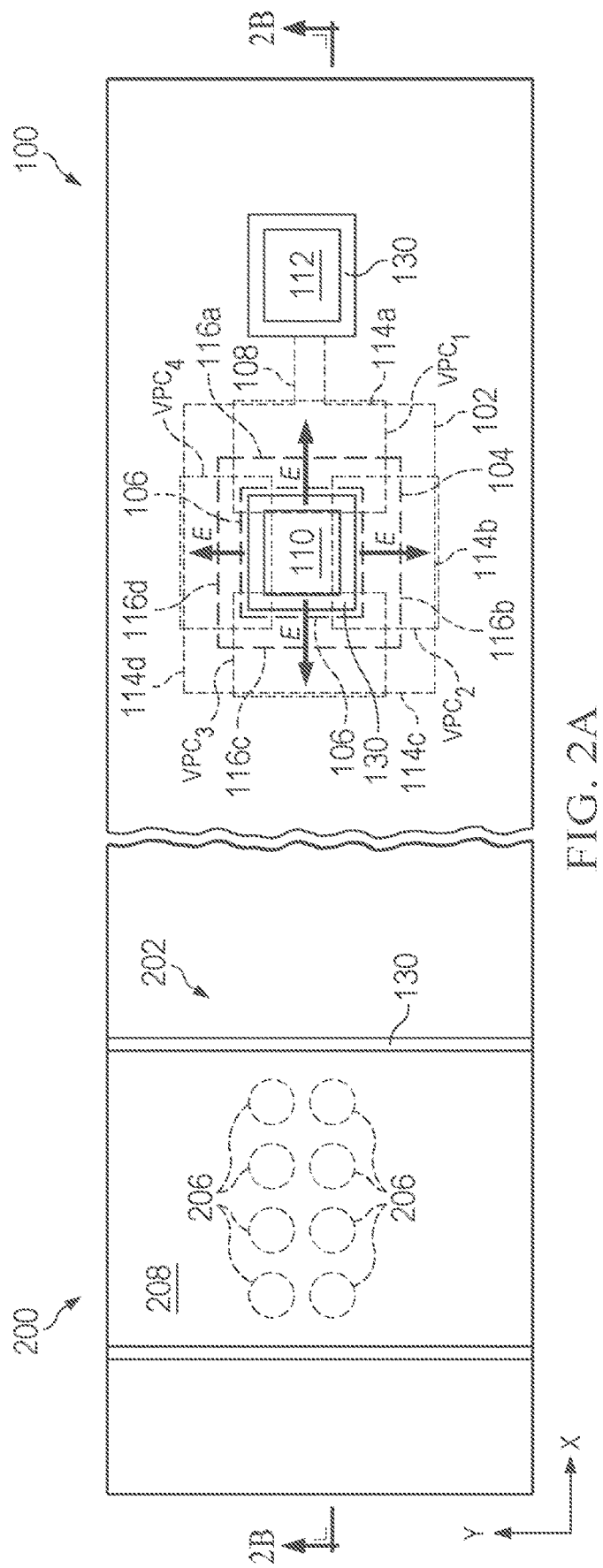
FIG. 2A is a top view and FIG. 2B is a side cross-sectional view showing an example IC structure including the example MIM capacitor module of FIGS. 1A-2B and an example IC component structure, which may be formed concurrently, according to one example.
Figure 2B:
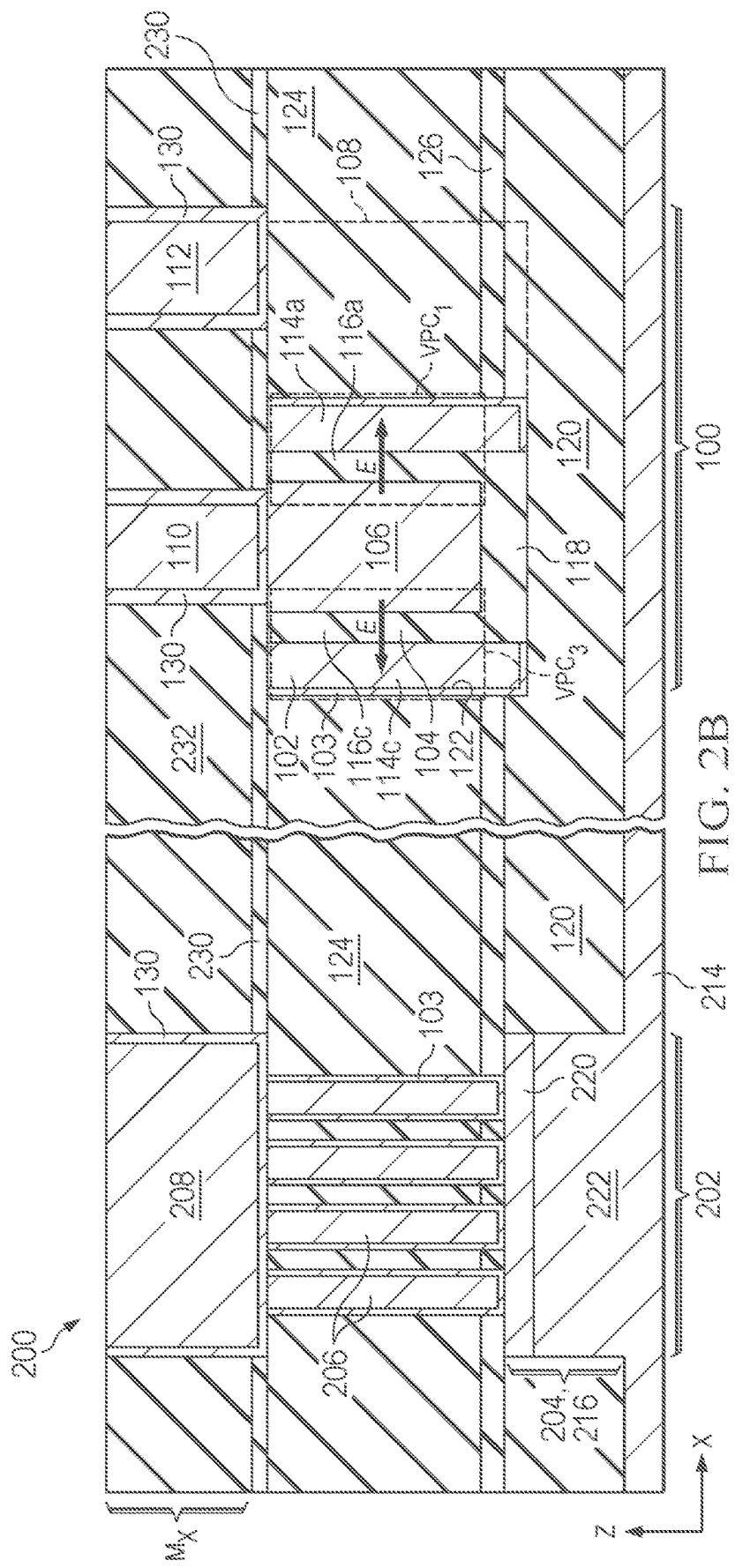

FIGS. 2A and 2B show an example IC structure 200 including the MIM capacitor module 100 shown in FIGS. 1A-1B and an IC component structure 202 formed concurrently, according to one example. In particular, FIG. 2A shows a top view of the example IC structure 200, and FIG. 2B shows a side cross-sectional view of the example IC structure 200 through cut line 2B-2B shown in FIG. 2A.

As mentioned above, the MIM capacitor module 100 may be constructed without adding any photomask operations to the background integrated circuit fabrication process (e.g., the background integrated circuit fabrication process for forming the IC component structure 202 and/or other IC components).

As discussed above, MIM capacitor module 100 includes outer electrode 102 including vertically-extending outer electrode sidewalls 114a-114d, insulator 104 including vertically-extending insulator sidewalls 116a-116d, inner electrode 106, outer electrode extension structure 108 which extends laterally from the vertically-extending outer electrode sidewall 114a, inner electrode contact element 110 electrically connected to the inner electrode 106, and outer electrode contact element 112 electrically connected to the outer electrode extension structure 108.

As discussed above, the inner electrode 106 is capacitively coupled to respective vertically-extending outer electrode sidewalls 114a-114d through respective vertically-extending insulator sidewalls 116a-116d to effectively define four vertical-plate capacitor units, indicated generally at $VPC_1$-$VPC_4$, each creating a horizontally-extending electric field "E" extending in the x-direction or y-direction.

As shown in FIG. 2B, the IC component structure 202 may include an IC component 204, at least one vertically-extending IC component contact 206 electrically connected to the IC component 204 (by direct contact or through liner 103, if present), and an IC component connection element 208 electrically connected to the at least one vertically-extending IC component contact 206 (by direct contact or through barrier layer 130, if present). The IC component 204 may be part of a transistor structure, such as a source or drain region, or any other type of integrated circuit component.

As shown, the IC component 204 may be formed on, or over, a substrate 214, e.g., a silicon substrate. In the illustrated example, the IC component 204 comprises a silicided active region 216 adjacent to a shallow trench isolation (STI) field oxide region 120, which is formed over substrate 214. The silicided active region 216 may include a metal silicide region 220 formed on an active silicon region 222. In another example, the IC component 204 may comprise a silicided polysilicon region, e.g., a poly gate of a transistor.

Etch stop layer 126 may be formed over the lower dielectric region 120 (e.g., STI field oxide), and dielectric region 124 (e.g., PMD region) may be formed over etch stop layer 126. At least one vertically-extending IC component contact 206, along with the outer electrode 102, insulator 104, inner electrode 106, and outer electrode extension structure 108 of MIM capacitor module 100, may be formed in the dielectric region 124 (e.g., PMD region), e.g., using a damascene process as discussed below with respect to FIGS. 3A-3H. Each vertically-extending IC component contact 206 and the outer electrode 102 may be deposited over a liner 103, e.g., comprising TiN, as discussed below with reference to FIG. 3C.

The IC component connection element 208, along with the inner electrode contact element 110 and outer electrode contact element 112 of MIM capacitor module 100, may be formed in metal layer $M_x$, for example a Metal-1 interconnect layer comprising copper, aluminum, or other metal. The IC component connection element 208, inner electrode contact element 110, and outer electrode contact element 112 may be formed in respective openings formed (etched) in a dielectric region 232 using a damascene process as discussed below with respect to FIG. 3J. Dielectric region 232 may comprise silicon oxide, fluorosilicate glass (FSG), organosilicate glass (OSG), porous OSG, or other low-k dielectrics (e.g., having a dielectric constant k less than 4.0). An upper etch stop layer 230 formed on the dielectric region 124 may be used to control the depth of the openings etched in dielectric region 232. IC component connection element 208, inner electrode contact element 110, and outer electrode contact element 112 may each be formed over conductive barrier layer 130 formed in the respective openings in dielectric region 232.

FIGS. 3A-3J show an example method of forming the example IC structure 200 shown in FIGS. 2A and 2B, including the example MIM capacitor module 100 and example IC component structure 202. In other examples, the example IC component structure 202 may be optional, such that MIM capacitor module 100 may be formed by the process described below but without the elements of IC component structure 202.

Figure 3A:
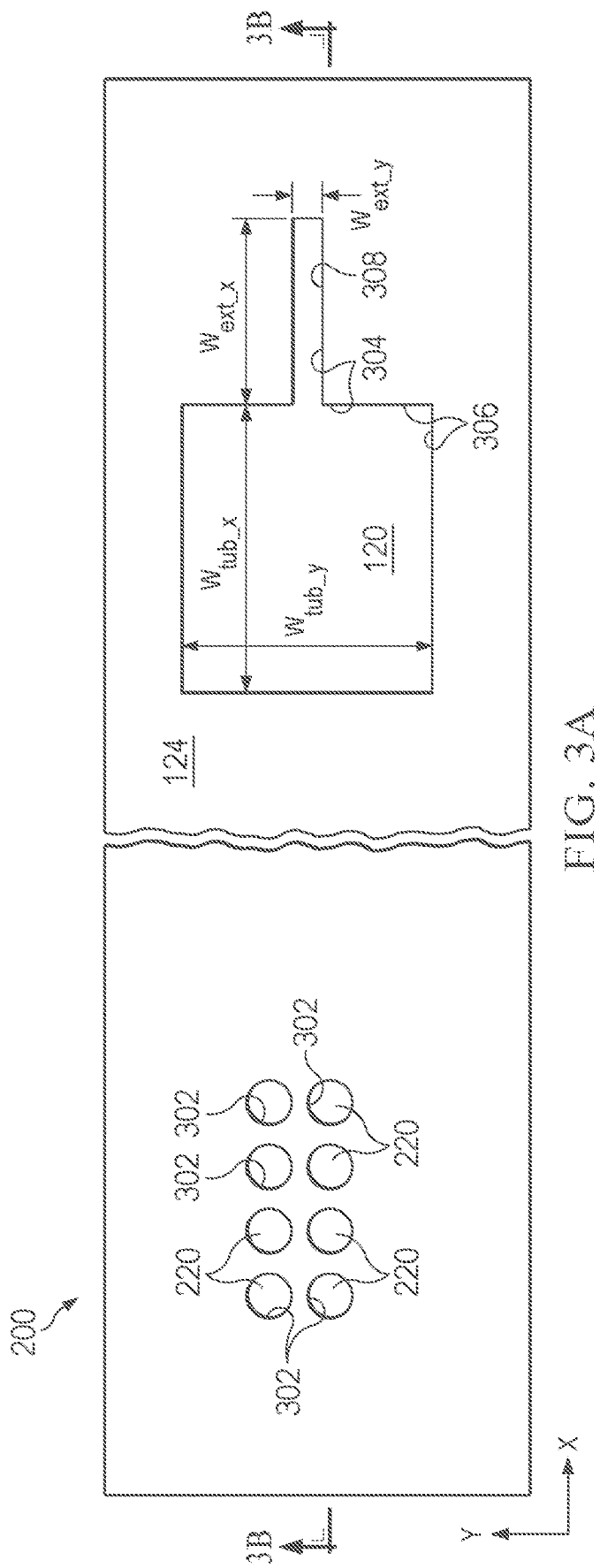
FIGS. 3A-3J show an example method of forming the example IC structure shown in FIGS. 2A and 2B, including the example MIM capacitor module and example IC component structure.
Figure 3B:
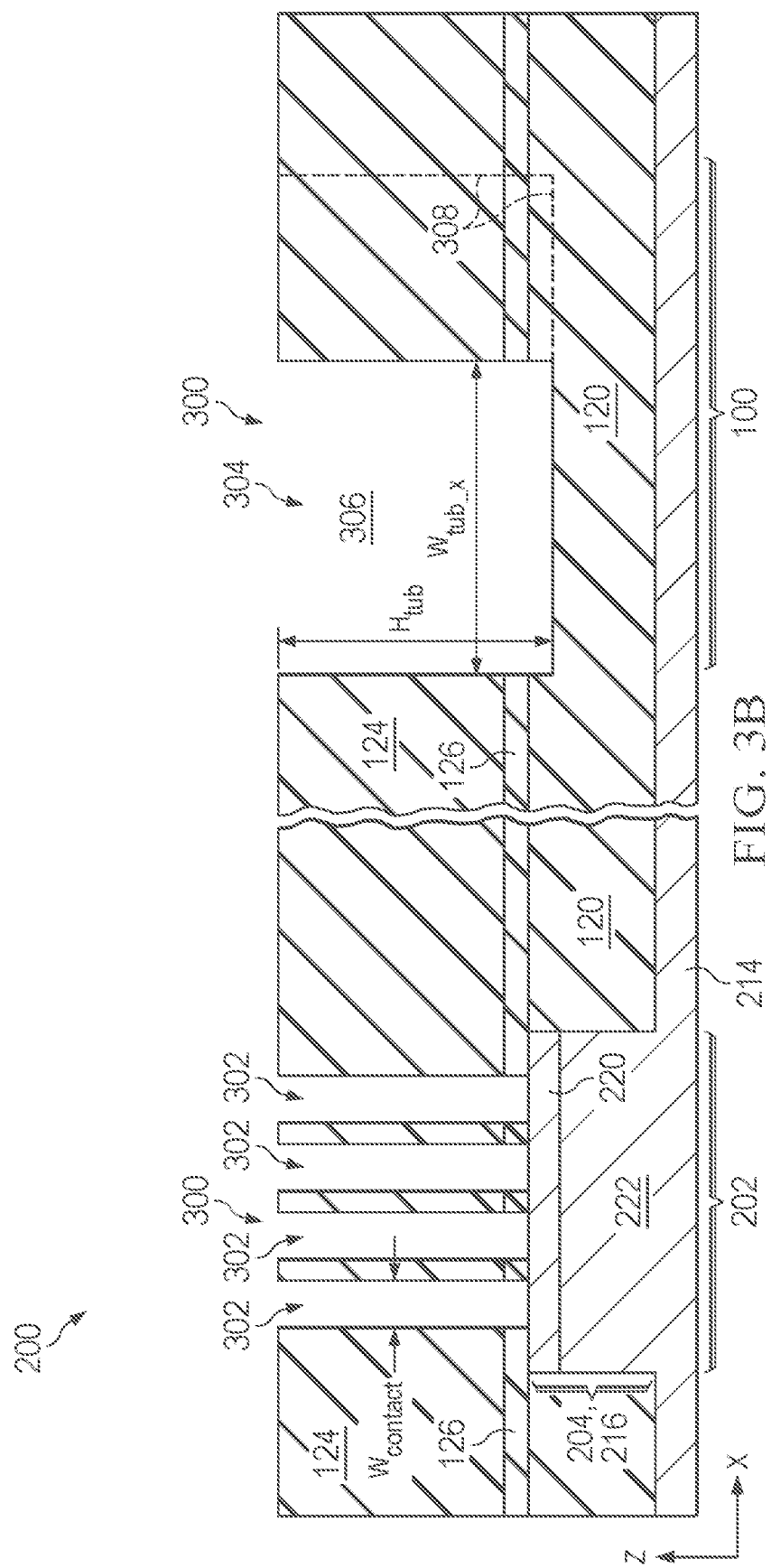

As shown in FIG. 3A (top view) and FIG. 3B (cross-sectional side view through line 3B-3B shown in FIG. 3A), the example IC component 204 and/or additional IC components (not shown) are formed on the substrate 214, e.g., a silicon substrate. As discussed above, the example IC component 204 comprises a silicided active region 216 adjacent to STI field oxide region 120, which is formed over substrate 214. As discussed above, the silicided active region 216 may include a metal silicide region 220 formed on an active region 222.

An etch stop layer 126 may be formed on the lower dielectric region 120 (e.g., STI field oxide), and extending over a top surface of the metal silicide region 220 of the example IC component 204. In some examples, etch stop layer 126 may comprise a silicon nitride etch stop layer, e.g., having a thickness in the range of 250 Å-750 Å. In other examples the etch stop layer 126 may be omitted.

Dielectric region 124 (e.g., PMD region) may be formed over etch stop layer 126 (or directly over the lower dielectric region 120 and top surface of the metal silicide region 220 in an example in which the etch stop layer 126 is omitted). In some examples, dielectric region 124 may comprise silicon oxide, phosphorus silicate glass (PSG), or borophosphosilicate glass (BPSG).

A number of openings 300, including IC component contact openings 302 and an outer electrode opening 304 may be patterned (using a photomask) and etched in the dielectric region 124. As shown, IC component contact openings 302 are laterally spaced apart from the outer electrode opening 304. Outer electrode opening 304 includes a tub opening region 306 and an extension opening region 308 extending laterally from the tub opening region 306.

Openings 300 may be formed using a plasma etch or other suitable etch, followed by a resist strip or other suitable process to remove remaining portions of photoresist material. In examples including etch stop layer 126, the depth of openings 300 may be controlled by the etch stop layer 126, e.g., to stop at a depth just below the etch stop layer 126 to thereby (a) expose a respective top surface area of the metal silicide region 220 at a bottom of each IC component contact opening 302 and (b) expose a top surface area of the lower dielectric region 120 (e.g., oxide region) at a bottom of the outer electrode opening 304.

The IC component contact openings 302 may have a width (or diameter or Critical Dimension (CD)) $W_{contact}$ in both the x-direction and y-direction in the range of 0.1-0.5 μm, for example.

In contrast, the tub opening region 306 of the outer electrode opening 304 may have a substantially larger width in the x-direction ($W_{tub\_x}$) and/or y-direction ($W_{tub\_y}$) than IC component contact openings 302. The shape and dimensions of the tub opening region 306 may be selected based on various parameters, e.g., for effective manufacturing of the MIM capacitor module 100 (e.g., effective formation of the outer electrode 102, insulator 104, and inner electrode 106 in the tub opening region 306) and/or for desired performance characteristics of the resulting MIM capacitor module 100. In one example, the tub opening region 306 may have a square or rectangular shape from the top view. In other examples, tub opening region 306 may have a circular or oval shape from the top view.

As noted above, a width of tub opening region 306 in the x-direction ($W_{tub\_x}$), y-direction ($W_{tub\_y}$), or both the x-direction and y-direction ($W_{tub\_x}$ and $W_{tub\_y}$) may be substantially larger than the width $W_{contact}$ of IC component contact openings 302 in the x-direction, y-direction, or both the x-direction and y-direction. For example, in some examples, each width $W_{tub\_x}$ and $W_{tub\_y}$ of tub opening region 306 is at least twice as large as the width $W_{contact}$ of IC component contact openings 302. In particular examples, each width $W_{tub\_x}$ and $W_{tub\_y}$ of tub opening region 306 is at least five time as large, or at least 10 times as large, as the width $W_{contact}$ of IC component contact openings 302. In some examples, $W_{tub\_x}$ and $W_{tub\_y}$ are each in the range of 1-100 μm.

Further, tub opening region 306 may be formed with a height-to-width aspect ratio of less than or equal to 1.0 in both the x-direction and y-direction, e.g., to allow effective filling of the tub opening region 306 by conformal materials. For example, tub opening region 306 may be formed with aspect ratios $H_{tub}/W_{tub\_x}$ and $H_{tub}/W_{tub\_y}$ respectively in the range of 0.01-1.0, for example in the range of 0.1-1.0. In some examples, aspect ratios $H_{tub}/W_{tub\_x}$ and $H_{tub}/W_{tub\_y}$ are respectively less than or equal to 1.0, e.g., for effective filling of tub opening region 306 by conformal materials, e.g., tungsten or silicon nitride. For example, tub opening region 306 may be formed with aspect ratios $H_{tub}/W_{tub\_x}$ and $H_{tub}/W_{tub\_y}$ respectively in the range of 0.1-1.0, or more particularly in the range of 0.5-1.0.

The extension opening region 308 of the outer electrode opening 304 has an x-direction width $W_{ext\_x}$ and a y-direction width $W_{ext\_y}$. The x-direction width $W_{ext\_x}$ may be in the range of 1-10 μm, and y-direction width $W_{ext\_y}$ may be in the range of 0.1-0.5 μm. In some examples, $W_{ext\_y}$ may be the same as $W_{contact}$. In other examples, $W_{ext\_y}$ may be greater than $W_{contact}$.

Figure 3C:
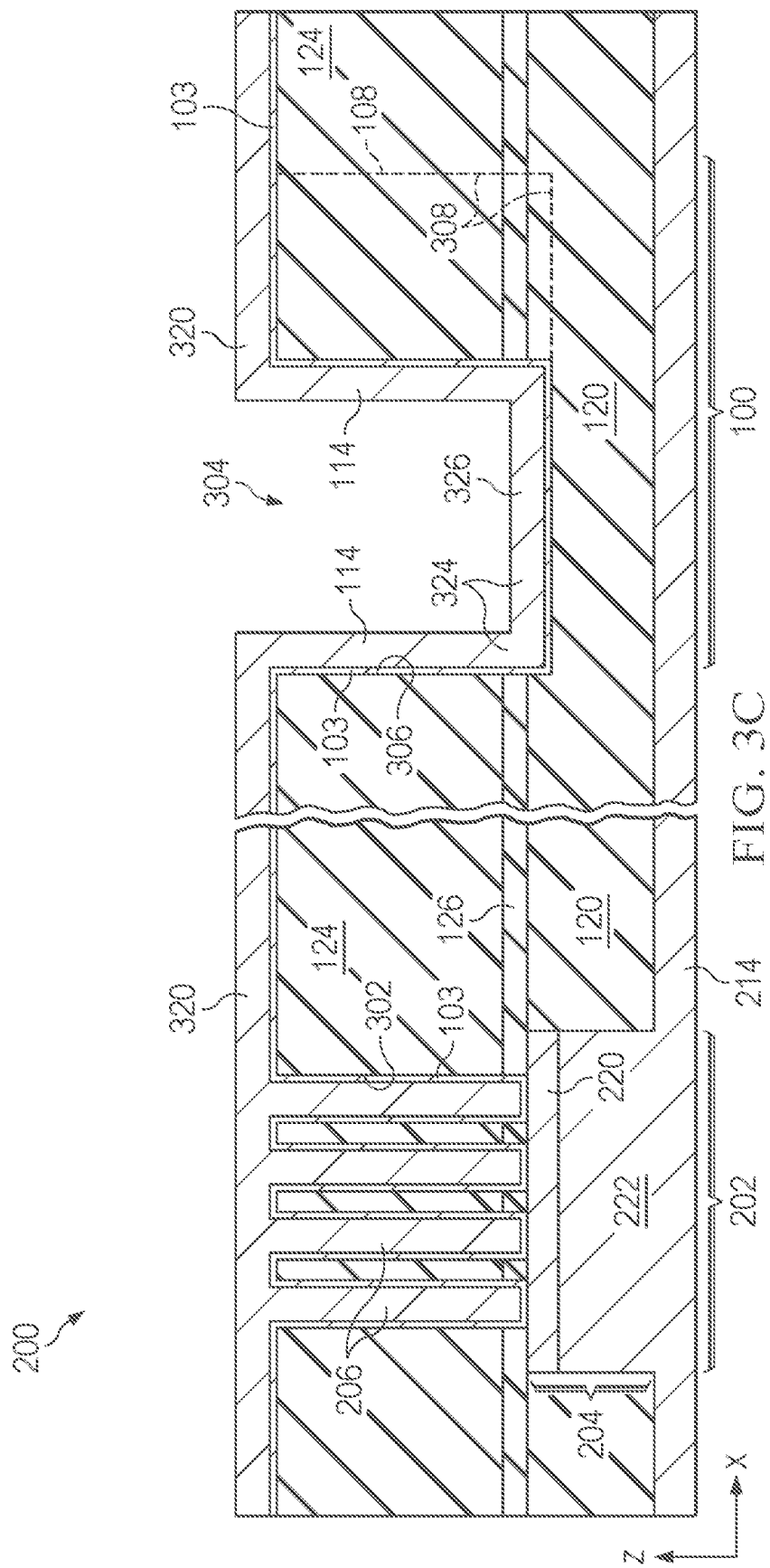

Next, as shown in FIG. 3C, a liner (or "glue layer") 103, e.g., comprising TiN with a thickness in the range of 50 Å-200 Å, is deposited over the structure and extends down into respective IC component contact openings 302 and outer electrode opening 304, including tub opening region 306 and extension opening region 308. A conformal metal layer 320 is deposited over the liner 103 and extends down into respective IC component contact openings 302 and outer electrode opening 304, including tub opening region 306 and extension opening region 308. The deposited conformal metal layer 320 (a) fills respective IC component contact openings 302 to form respective IC component contacts 206, (b) partially fills the tub opening region 306 of the outer electrode opening 304 to form an outer electrode cup 324 in the tub opening region 306, and (c) fills the extension opening region 308 of the outer electrode opening 304 to form the outer electrode extension structure 108 (more clearly shown in FIG. 3D, discussed below) in the extension opening region 308.

The outer electrode cup 324 includes a laterally-extending outer electrode cup base 326 and a plurality of vertically-extending outer electrode sidewalls 114 extending upwardly (in the z-direction) from a lateral perimeter edge of the laterally-extending outer electrode cup base 326. The outer electrode extension structure 108 extends laterally (in the x-direction) from a vertically-extending outer electrode sidewall 114.

In some examples, the conformal metal layer 320 comprises tungsten deposited with a thickness in the range of 1000 Å-5000 Å. In other examples, the conformal metal layer 320 may comprise Co, TiN, or other conformal metal. The conformal metal layer 320 may be deposited by a conformal chemical vapor deposition (CVD) process or other suitable deposition process.

Figure 3D:
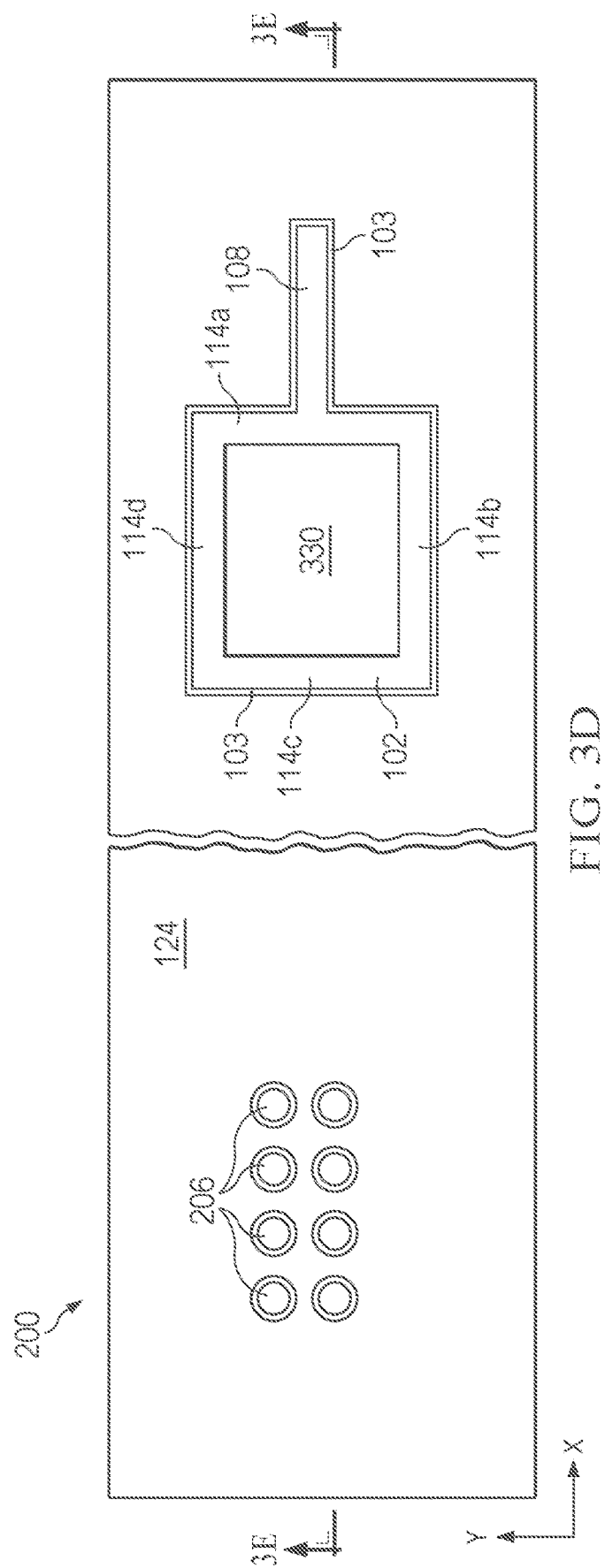
Figure 3E:
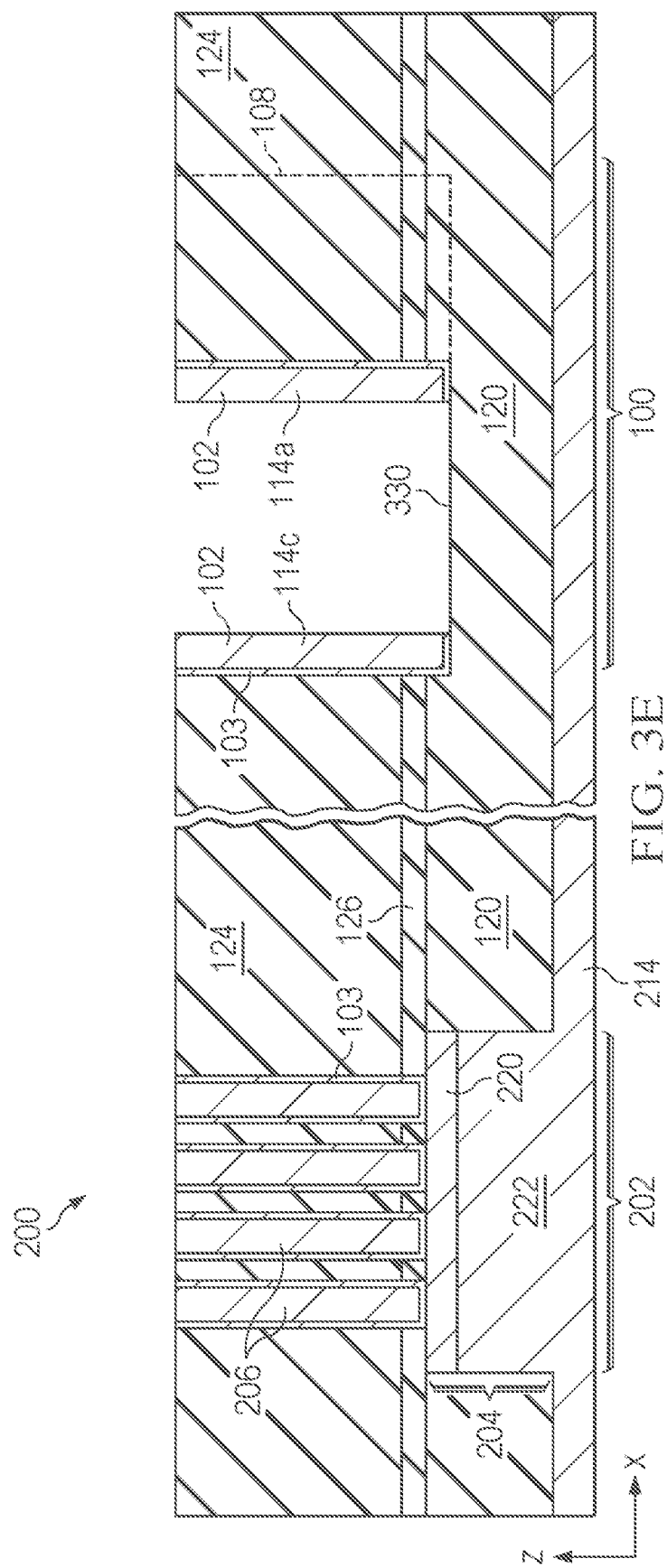

As shown in FIG. 3D (top view) and FIG. 3E (cross-sectional side view through line 3E-3E shown in FIG. 3D), an etch process is performed to remove the laterally-extending outer electrode cup base 326 (and underlying liner 103), along with portions of the conformal metal layer 320 (and underlying liner 103) outside (i.e., above) the IC component contact openings 302 and outer electrode opening 304. In some examples, the etch process may comprise an anisotropic dry etch. The etch process may expose an upper surface 330 of the lower dielectric region 120 (e.g., STI field oxide region)

As shown in FIGS. 3D and 3E, after the etch process, the conformal metal layer 320 remaining in the tub opening region 306 defines the outer electrode 102 including a plurality of vertically-extending outer electrode sidewalls 114a-114d extending upwardly from the lower dielectric region 120 (e.g., STI field oxide region). In this example, the vertically-extending outer electrode sidewalls 114a-114d define a closed-loop perimeter in the horizontal (x-y) plane, as shown in FIG. 3D. The outer electrode extension structure 108 extends laterally (in the x-direction) from the vertically-extending outer electrode sidewall 114a.

Figure 3F:
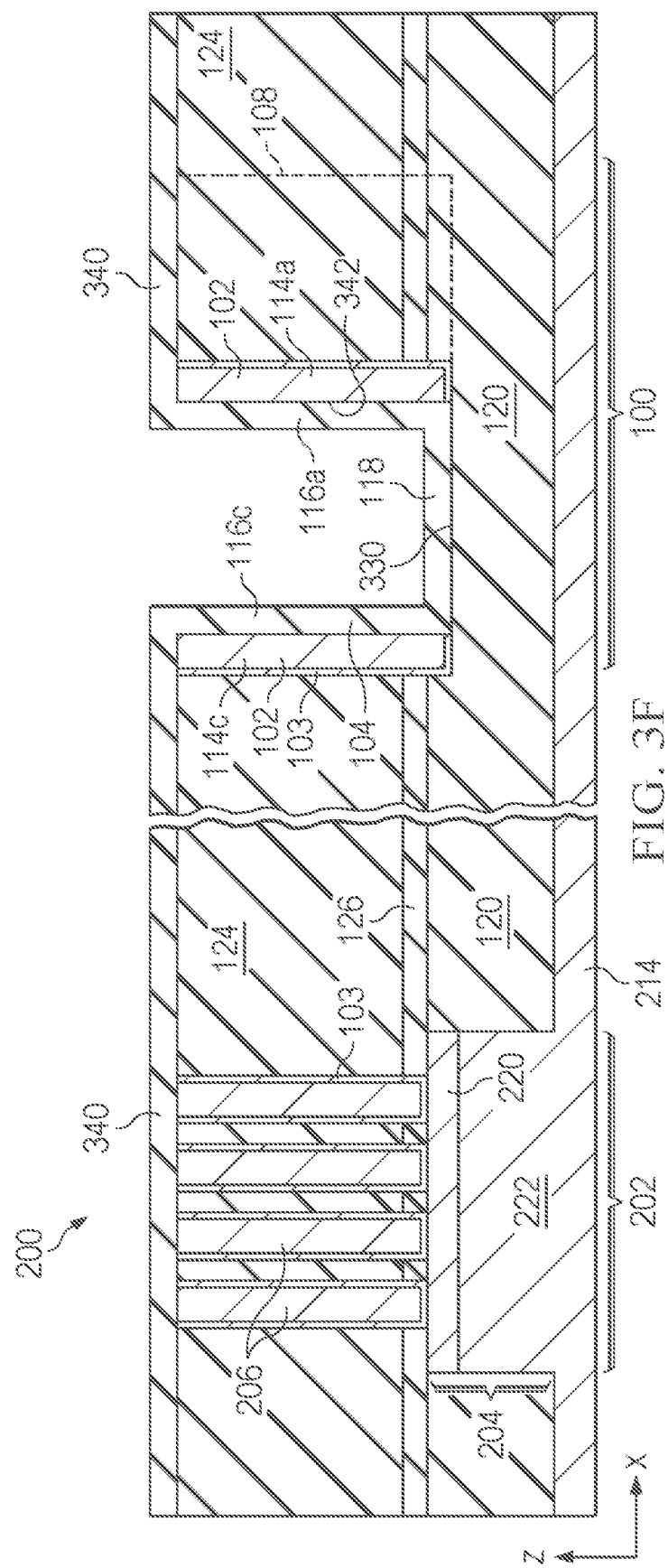

As shown in FIG. 3F, an insulator layer 340 is deposited over the structure and extends down into an opening 342 defined by the outer electrode sidewalls 114a-114d to form insulator 104, which may be cup-shaped. The insulator 104 includes (a) the laterally-extending insulator base 118 formed on the upper surface 330 of the lower dielectric region 120 and (b) the vertically-extending insulator sidewalls 116a-116d extending upwardly from the laterally-extending insulator base 118. In this example, the insulator sidewalls 116a-116d extends upwardly from a lateral perimeter edge of the laterally-extending insulator base 118. In some examples, insulator layer 340 comprises silicon nitride (SiN) deposited with a thickness in the range of 250 Å-750 Å by a Plasma Enhanced Chemical Vapor Deposition (PECVD) process. Alternatively, insulator layer 330 may comprise $Al_2O_3$, $ZrO_2$, $HfO_2$, $ZrSiO_x$, $HfSiO_x$, $HfAlO_x$, or $Ta_2O_5$, or other suitable capacitor insulator material deposited using an Atomic Layer Deposition (ALD) process.

In another example, the laterally-extending insulator base 118 may be removed, while leaving the vertically-extending insulator sidewalls 116a-116d substantially intact, such that the resulting insulator 104 includes vertically-extending insulator sidewalls 116a-116d extending upwardly from dielectric region 120, without the laterally-extending insulator base 118. For example, the laterally-extending insulator base 118 may be removed by an anisotropic etch that leaves the vertically-extending insulator sidewalls 116a-116d substantially intact.

Figure 3G:
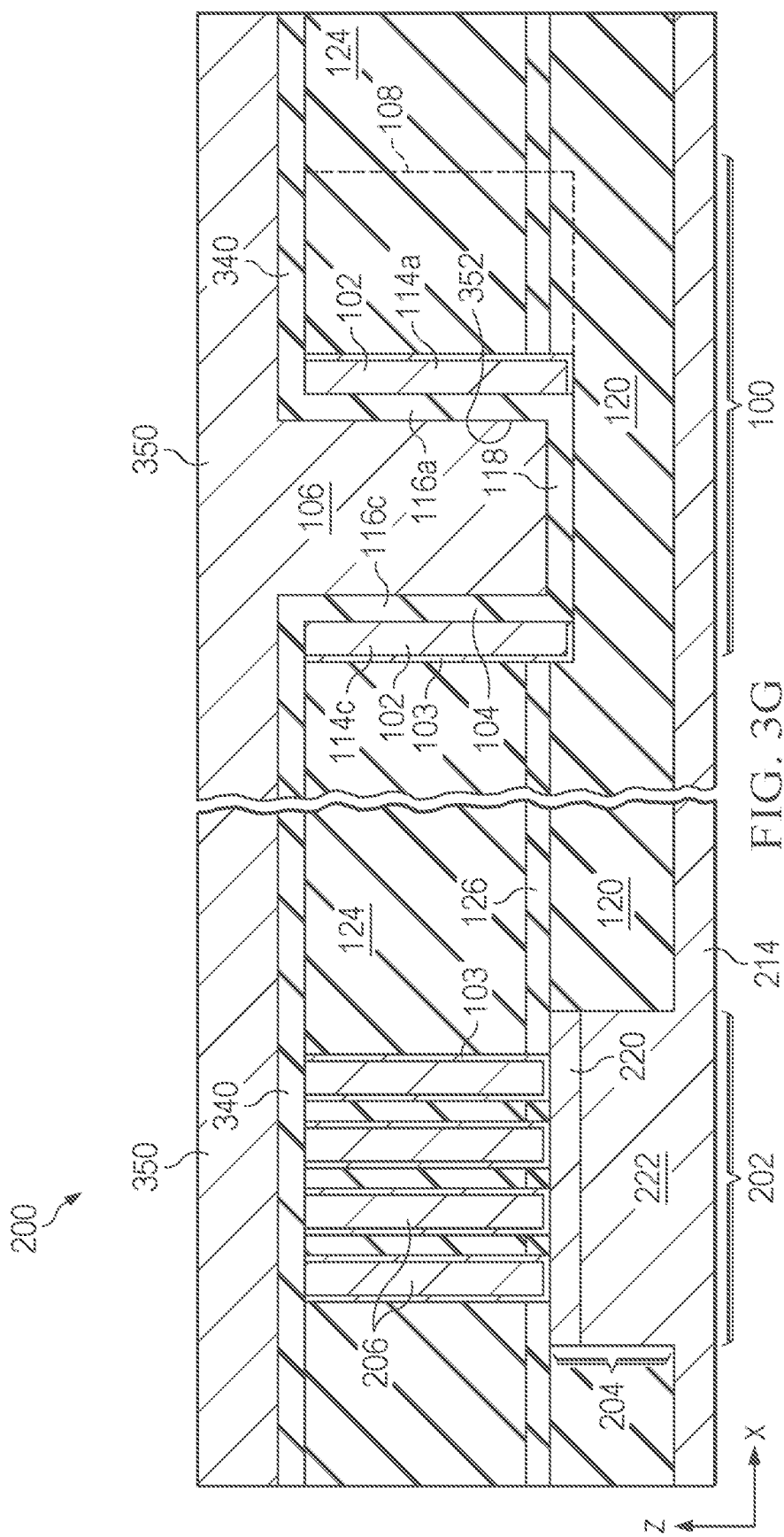

As shown in FIG. 3G, an inner electrode layer 350 is deposited over the insulator layer 340 and extends into and fills an opening 352 defined by the insulator 104, which as indicated above is cup-shaped, the inner electrode layer 350 thereby forming inner electrode 106 within opening 352. In some examples, inner electrode layer 350 may comprise Al, Ti, TiN, W, or a combination thereof, for example TiN and Al, and may be deposited by a physical vapor deposition (PVD) process.

Figure 3H:
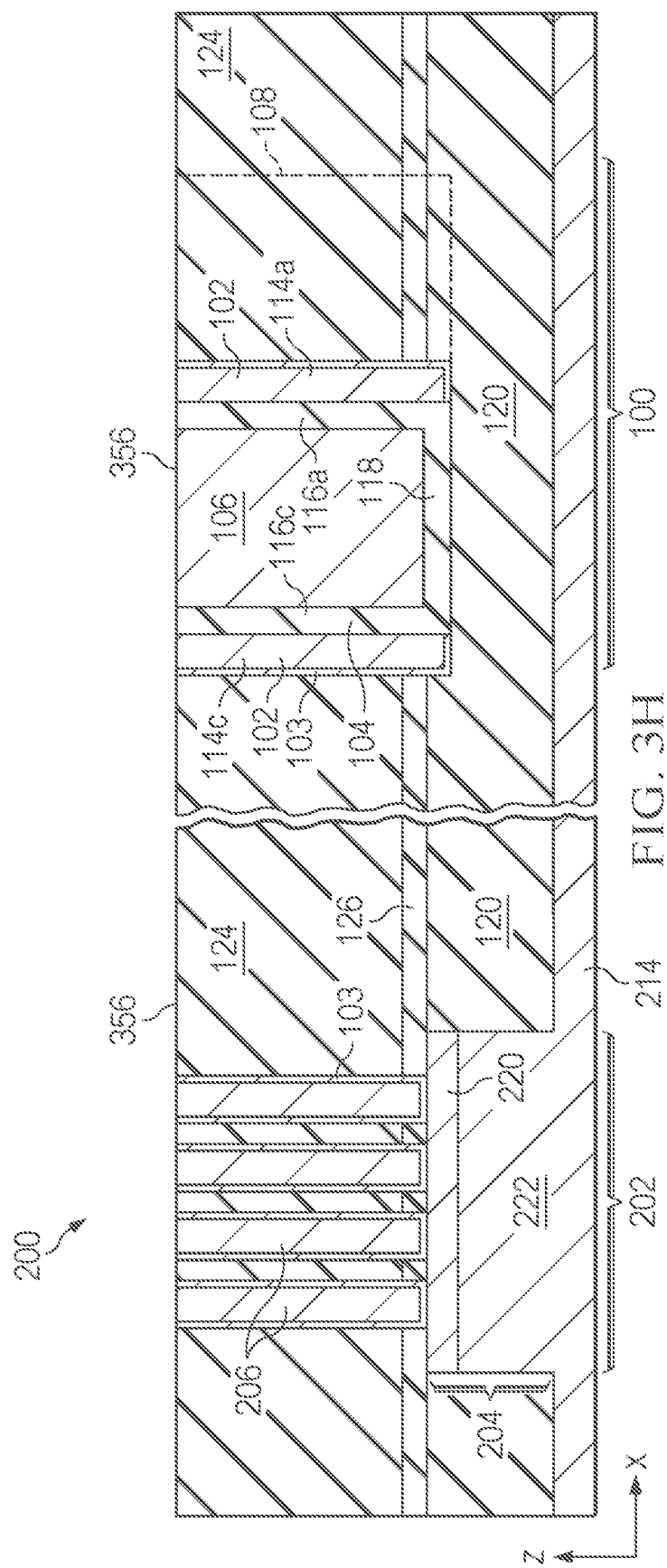

As shown in FIG. 3H, a planarization process, e.g., chemical mechanical planarization (CMP) process, is performed to remove upper portions of the inner electrode layer 350 and insulator layer 340. The planarization process defines a planarized upper surface 356 and defines a final form of the vertically-extending IC component contacts 206, outer electrode 102, insulator 104, inner electrode 106, and outer electrode extension structure 108.

Figure 3I:
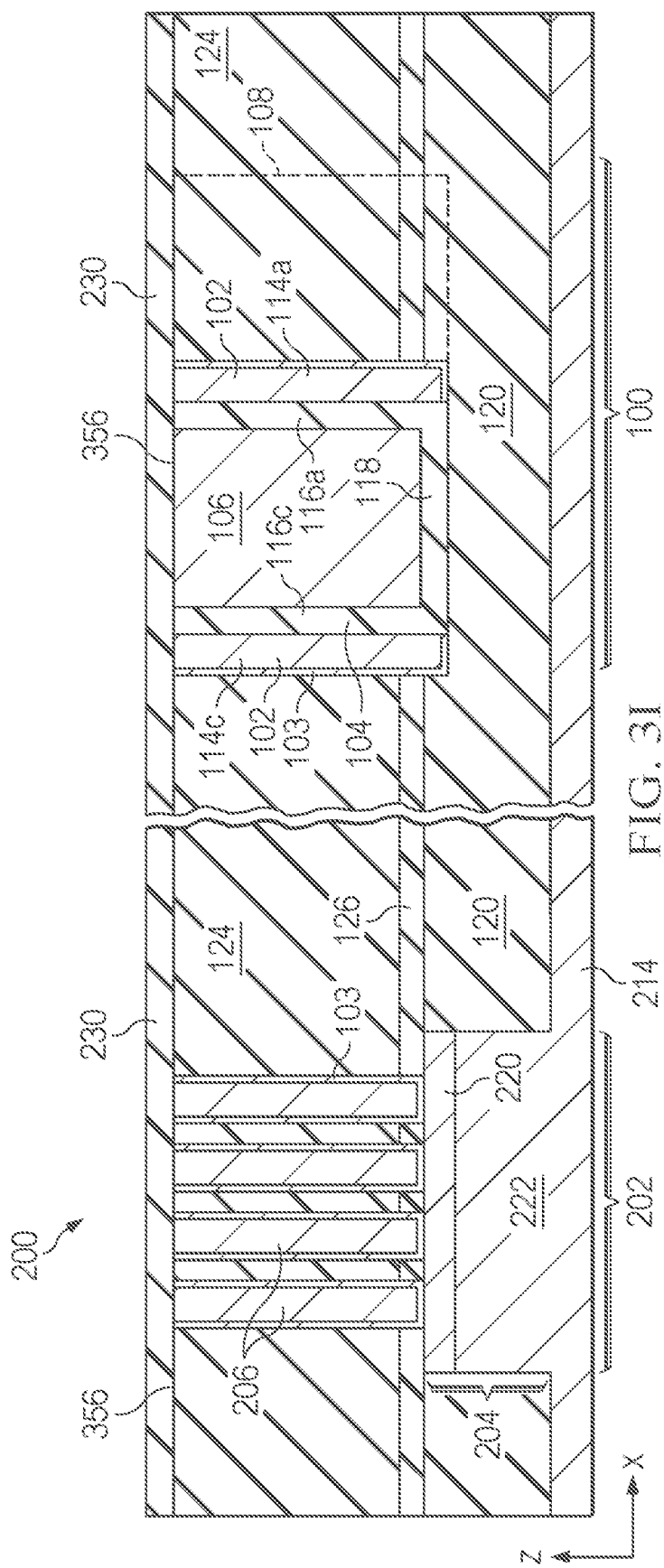

As shown in FIG. 3I, an etch stop layer 230 is deposited on the planarized upper surface 356 defined by the planarization process. In some examples, etch stop layer 230 may comprise SiN, SiC, or suitable high-k dielectric film (e.g., having a dielectric constant above 7.0), and may be deposited with a thickness in the range of 250 Å-750 Å. Etch stop layer 230 may function to terminate an edge of the electric field generated by the MIM capacitor module 100. As a result, the inclusion of the etch stop layer 230 may relieve unwanted electric field edge effects near the planarized upper surface 356 and thereby increase the breakdown voltage of the MIM capacitor module 100. In addition, the etch stop layer 230 may function as a diffusion barrier to reduce diffusion from the inner electrode 106, e.g., where the inner electrode 106 is formed from copper or other diffusion prone metal.

Figure 3J:
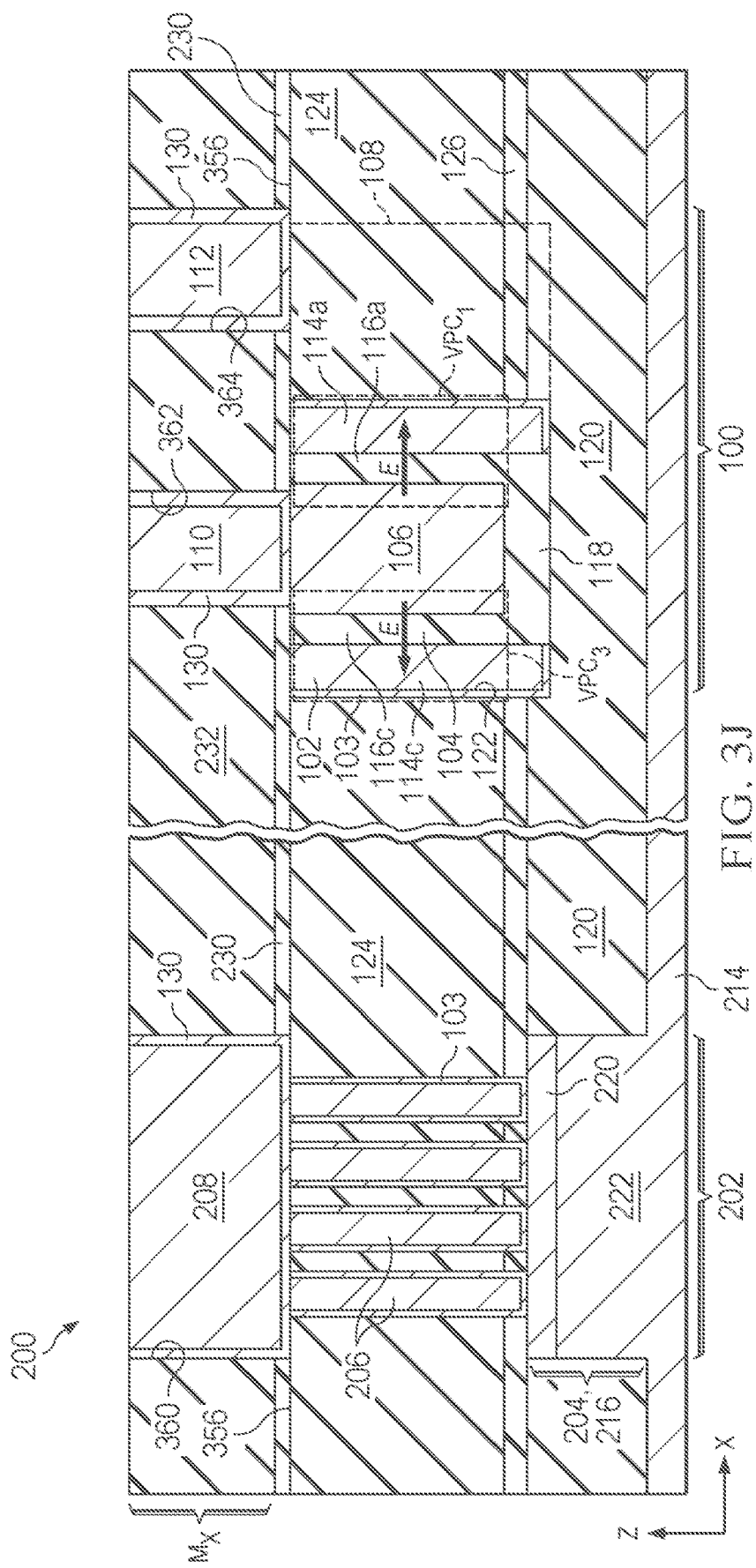

Next, as shown in FIG. 3J, the upper metal layer $M_x$, including the IC component connection element 208, inner electrode contact element 110, and outer electrode contact element 112, is formed, e.g., by a damascene process. In one example, upper metal layer $M_x$ comprises a copper interconnect layer formed by a copper damascene process.

To form the upper metal layer $M_x$, dielectric layer 232 is deposited over the etch stop layer 230. In some examples, dielectric layer 232 may comprise silicon oxide, FSG (FluoroSilicate Glass), OSG (Organ® Silicate Glass), or porous OSG. Dielectric layer 232 may be patterned and etched to form (a) an IC component connection element opening 360 (e.g., trench opening) above IC component contacts 206, (b) an inner electrode contact opening 362 above the inner electrode 106, and (c) an outer electrode contact opening 364 above the outer electrode extension structure 108.

Openings 360, 362, and 364 may be formed using a plasma etch or other suitable etch, followed by a resist strip or other suitable process to remove remaining portions of photoresist material. The depth of openings 360, 362, and 364 may be controlled by the etch stop layer 230, e.g., to stop at a depth just below the etch stop layer 230 to thereby expose (a) a respective top surface area of each IC component contact 206, (b) expose a top surface area of inner electrode 106, and (c) a top surface area of outer electrode extension structure 108.

Barrier layer 130 (e.g., a TaN/Ta bilayer) and a copper seed layer may be deposited over the dielectric layer 232 and extends down into the openings 360, 362, and 364. A copper plating process may then be performed, which fills the openings 360, 362, and 364 with copper. A copper anneal may be performed, followed by a copper CMP process to remove portions of the copper above openings 360, 362, and 364, thereby defining (a) the IC component connection element 208 electrically connected to the IC component contacts 206, (b) the inner electrode contact element 110 electrically connected to the inner electrode 106, and (c) the outer electrode contact element 112 electrically connected to the outer electrode extension structure 108. In other examples, others metal (other than copper) suitable for damascene processing may be used to form the IC component connection element 208, inner electrode contact element 110, and outer electrode contact element 112, for example, tungsten (W), cobalt (Co), or aluminum (Al).

After forming the upper metal layer $M_x$ as discussed above, the process may continue to construct additional interconnect structures, e.g., by constructing additional metal layers separated by respective dielectric layers.

With reference to the completed MIM capacitor module 100 shown in FIG. 3J, as discussed above (e.g., with respect to FIGS. 1A-1C and FIGS. 2A-2B) the inner electrode 106 is capacitively coupled to respective vertically-extending outer electrode sidewalls 114a-114d through respective vertically-extending insulator sidewalls 116a-116d to effectively define four vertical-plate capacitor units, indicated generally at $VPC_1$-$VPC_4$, each creating a horizontally-extending electric field "E" extending in the x-direction or y-direction.

The invention claimed is:

1. A metal-insulator-metal (MIM) capacitor module, comprising:

an outer electrode comprising a plurality of vertically-extending outer electrode sidewalls;
an insulator formed in an opening defined by the plurality of vertically-extending outer electrode sidewalls, the insulator comprising a plurality of vertically-extending insulator sidewalls;
an inner electrode formed in an interior opening defined by the plurality of vertically-extending insulator sidewalls;
wherein respective ones of the plurality of vertically-extending insulator sidewalls are arranged between the inner electrode and a respective one of the plurality of vertically-extending outer electrode sidewalls;
an outer electrode extension structure extending laterally from a particular vertically-extending outer electrode sidewall of the plurality of vertically-extending outer electrode sidewalls; and
an inner electrode contact element and an outer electrode contact element formed in a metal layer, wherein the inner electrode contact element is electrically connected to the inner electrode, and the outer electrode contact element is electrically connected to the outer electrode extension structure.

2. The MIM capacitor module of claim 1, wherein:
the particular outer electrode sidewall is elongated in a first lateral direction; and
the outer electrode extension structure is elongated in a second lateral direction perpendicular to the first lateral direction.

3. The MIM capacitor module of claim 1, wherein:
the outer electrode has a closed-loop perimeter defined by the plurality of vertically-extending outer electrode sidewalls; and
the insulator has a closed-loop perimeter defined by the plurality of vertically-extending insulator sidewalls.

4. The MIM capacitor module of claim 3, wherein the insulator has a cup-shaped structure including the plurality of vertically-extending insulator sidewalls extending upwardly from a laterally-extending insulator base.

5. The MIM capacitor module of claim 4, wherein the laterally-extending insulator base lies directly on a dielectric region.

6. A device, comprising:
a metal-insulator-metal (MIM) capacitor module, comprising:
an outer electrode comprising a plurality of vertically-extending outer electrode sidewalls formed from a conformal metal;
an insulator formed in an opening defined by the plurality of vertically-extending outer electrode sidewalls, the insulator comprising a plurality of vertically-extending insulator sidewalls;
an inner electrode formed in an interior opening defined by the plurality of vertically-extending insulator sidewalls;
wherein respective ones of the plurality of vertically-extending insulator sidewalls are arranged between the inner electrode and a respective one of the plurality of vertically-extending outer electrode sidewall; and
an outer electrode extension structure extending laterally from a particular vertically-extending outer electrode sidewall of the plurality of vertically-extending outer electrode sidewalls;
an inner electrode contact element and an outer electrode contact element formed in a metal layer, wherein the inner electrode contact element is electrically connected to the inner electrode, and the outer electrode contact element is electrically connected to the outer electrode extension structure; and
an integrated circuit (IC) component structure, comprising:
an IC component;
a vertically extending IC component contact formed from the conformal metal, the vertically extending IC component contact formed above the IC component and electrically connected to the IC component; and
an IC component connection element formed in the metal layer and electrically connected to the vertically extending IC component contact.

7. The device of claim 6, wherein the IC component comprises a silicided polysilicon structure.

8. The device of claim 6, wherein the IC component comprises a transistor structure.

9. The device of claim 6, wherein:
the particular vertically-extending outer electrode sidewall is elongated in a first lateral direction; and
the outer electrode extension structure is elongated in a second lateral direction perpendicular to the first lateral direction.

10. The device of claim 6, wherein:
the outer electrode has a closed-loop perimeter defined by the plurality of vertically-extending outer electrode sidewalls; and
the insulator has a closed-loop perimeter defined by the plurality of vertically-extending insulator sidewalls.

11. The device of claim 10, wherein the insulator has a cup-shaped structure including the plurality of vertically-extending insulator sidewalls extending upwardly from a laterally-extending insulator base.

12. The device of claim 11, wherein the laterally-extending insulator base lies directly on a dielectric region.

* * * * *